US009219475B2

(12) United States Patent
Groot et al.

(10) Patent No.: US 9,219,475 B2
(45) Date of Patent: Dec. 22, 2015

(54) POWER ARBITRATION METHOD AND APPARATUS HAVING A CONTROL LOGIC CIRCUIT FOR ASSESSING AND SELECTING POWER SUPPLIES

(71) Applicant: NXP B.V., Eindhoven (NL)

(72) Inventors: Cas Groot, Antwerp (BE); Marco Lammers, Helmond (NL)

(73) Assignee: NXP B.V., Eindhoven (NL)

( * ) Notice: Subject to any disclaimer, the term of this patent is extended or adjusted under 35 U.S.C. 154(b) by 300 days.

(21) Appl. No.: 13/875,118

(22) Filed: May 1, 2013

(65) Prior Publication Data

US 2014/0327475 A1    Nov. 6, 2014

(51) Int. Cl.
 *G06F 1/32* (2006.01)
 *H03K 17/22* (2006.01)
 *H02J 7/00* (2006.01)
(52) U.S. Cl.
 CPC .............. *H03K 17/22* (2013.01); *H02J 7/0068* (2013.01); *H02J 2007/0095* (2013.01)
(58) Field of Classification Search
 None
 See application file for complete search history.

(56) References Cited

U.S. PATENT DOCUMENTS

| 5,642,063 | A  | * | 6/1997 | Lehikoinen ..................... 327/74 |
| 7,024,571 | B1 | * | 4/2006 | Reger et al. ................... 713/323 |
| 7,960,864 | B2 |   | 6/2011 | Riedel et al. |
| 2006/0244460 | A1 |   | 11/2006 | Weaver |
| 2006/0262579 | A1 |   | 11/2006 | Chou |
| 2008/0054855 | A1 |   | 3/2008 | Hussain et al. |
| 2010/0156470 | A1 | * | 6/2010 | Maltione et al. ................ 327/77 |

* cited by examiner

*Primary Examiner* — Paul Yanchus, III

(57) ABSTRACT

A power selector for switching power supplies is implemented using a variety of methods and devices. According to an example embodiment of the present disclosure, an arrangement provides power to a circuit by selecting between a first supply and a second supply. The first power circuit provides a regulated level of power to the integrated circuit (IC) having an operating power level specified as a circuit operating level for providing power to the IC. The second power circuit provides power to the IC. A power-signal arbitration circuit for assessing $V_{DDREG}$ and whether the second power circuit is to provide power to the IC as an alternative to the first power circuit providing power to the IC is based on a threshold power level indicative of the specified operating power level and the regulated level of power. Based on the power-signal arbitration circuit's assessment, providing an arbitration-control signal to the power-signal switching circuit.

18 Claims, 5 Drawing Sheets

POWER ARBITRATION METHOD AND APPARATUS HAVING A CONTROL LOGIC CIRCUIT FOR ASSESSING AND SELECTING POWER SUPPLIES

Various embodiments of the present disclosure are directed to providing power to an Integrated Circuit Chip by switching between a first power supply and a second power supply and more particularly to using switches to select one or more of the power supplies.

Modern integrated circuits are often prevented from achieving low-power specifications due to excessive leakage currents. Motivated to achieve the desired low-power specifications of modern integrated circuits, the semiconductor industry now relies on multiple power domains, on-chip power gating, and voltage scaling techniques to effectively bound leakage current.

Most integrated circuits with multiple power domains are composed of a performance domain and lower power domain. The low power domain, i.e. always on domain, typically contains control functions for power-up sequences, mode settings, data storage, and/or simple peripherals. As indicated by the name, an always-on domain should remain powered at all times. Hence, a regulated power supply and often a battery are connected to the integrated circuit to ensure a continuous power supply to the always-on domain.

To improve battery lifetime, a power selector circuit can select a power supply based on the maximum voltage of two inputs. For example, a diode bridge can select the highest supply between the regulated voltage and battery supply. The diode bridge guarantees the always-on-domain is constantly powered by either the regulated or battery supply. The diode bridge will use the regulated supply instead of the battery supply only if the regulated supply is higher in absolute voltage.

Where an integrated circuit (IC) has a main power supply and a backup power supply, the backup supply (e.g., a battery) allows the circuit to continue to function when the main power supply is interrupted or drops below a threshold voltage level of the IC. A power selector circuit can be used to switch the internal power of the circuit between the main supply and the backup supply, it may also be desirable to have a power selector that uses the internal power supply voltage and requires a lower amount of power. As circuits continue to decrease in size, it is also desirable for a power selector circuit to occupy a small area.

These and other matters have presented challenges to power selector circuits for a variety of applications.

Various example embodiments are directed to power selector circuits and their implementation.

An example embodiment of the present disclosure includes a first power circuit, a second power circuit, a control logic circuit, and a power-signal switching circuit. The first power circuit provides a regulated level of power to the IC, and has an operating power level specified as a circuit operating level for providing power to the IC. The second power circuit is also configured to provide power to the IC. A control logic circuit determines whether the second power circuit is to provide power to the IC as an alternative to the first power circuit providing power to the IC, based on a threshold power level indicative of the specified operating power level and the regulated level of power. Based on the assessment, the control logic circuit provides an arbitration-control signal to a power-signal switching circuit. The power-signal switching circuit is responsive to the control logic circuit and connected to receive power from each of the first and the second power circuits for providing power to the IC. In response to the arbitration-control signal, the power-signal switching circuit enables power to be provided to the IC from a selected one of the first power circuit and the second power circuit.

In another exemplary embodiment of the present disclosure, a method is disclosed for selecting a power circuit for a power-controlled IC having a specified operating power level. First, the power selector circuit powers the diode block, bias circuit, control logic circuit, and power-signal switching circuit with the second power circuit upon power-up. Secondly, determining if the first power circuit is above the specified operating power level or a threshold level, then the first power circuit is selected to provide power to the IC, if the first power circuit is below the specified operating power level or a threshold level, then the secondary power circuit continues to power the power-controlled integrated circuit. Finally, the control logic circuit selects the second power circuit to power the IC if the first power circuit falls below the specified operating power level or a threshold level.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
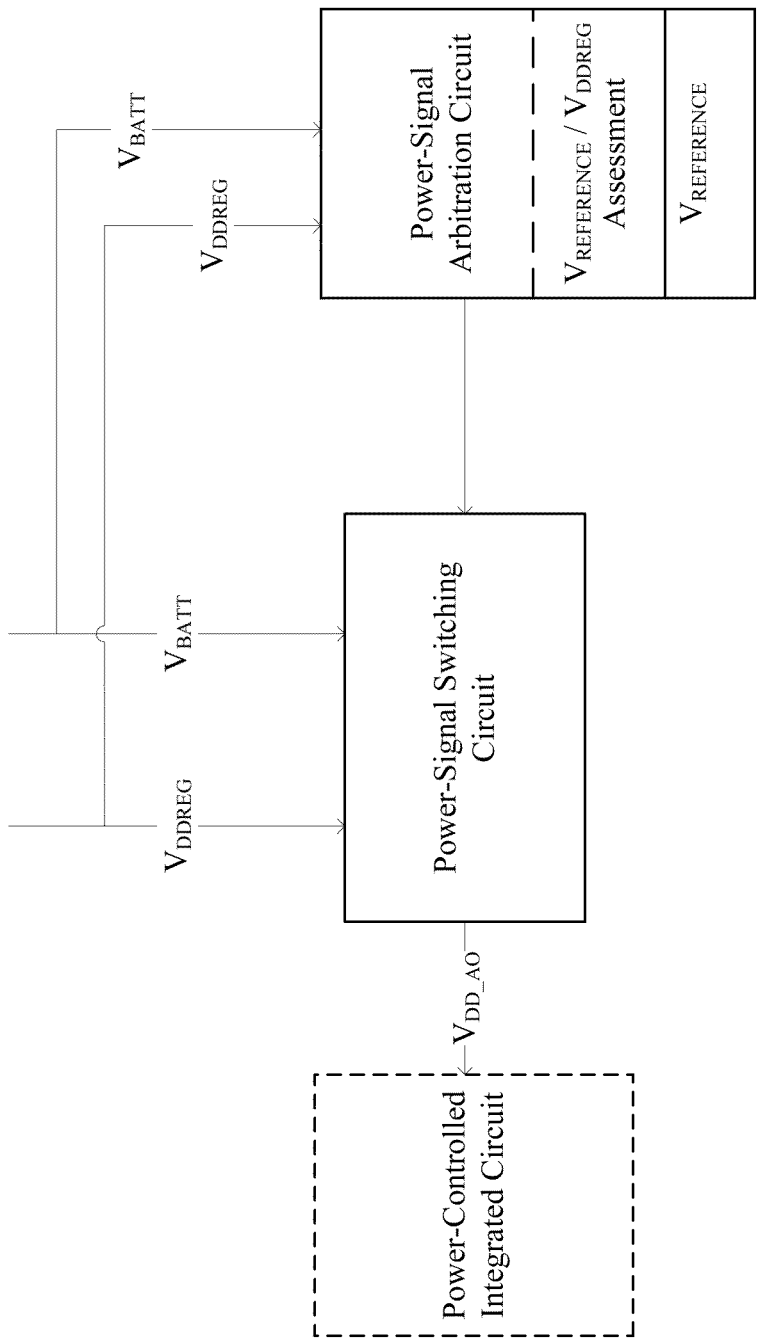
FIG. 1 shows a block diagram of one embodiment of the present disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the disclosure is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of devices, systems and arrangements including powering integrated circuits. While the present disclosure is not necessarily so limited, various aspects of the disclosure may be appreciated through a discussion of examples using this context.

Various example embodiments are directed to powering integrated circuits utilizing a power selector circuit. In some exemplary embodiments, the first power circuit is presented as a regulated power supply, and the second power circuit is presented as a battery power supply, while the present disclosure is not necessarily so limited, various aspects of the disclosure may be appreciated through a discussion of examples using this context.

Also, in some exemplary embodiments and figures according to the exemplary embodiments, the power-signal arbitration circuit may comprise some or all of the following components: a control logic circuit, an overrule circuit, a compare circuit, a reference circuit, a bias circuit, and a diode block.

An example embodiment of the present disclosure includes a first power circuit, a second power circuit, a control logic circuit, and a power-signal switching circuit. The first power circuit provides a regulated level of power to the IC, and has an operating power level specified as a circuit operating level for providing power to the IC. The second power circuit is also configured to provide power to the IC. A control logic circuit determines whether the second power circuit is to provide power to the IC as an alternative to the first power circuit providing power to the IC, based on a threshold power level indicative of the specified operating power level and the regulated level of power. Based on the assessment, the control logic circuit provides an arbitration-control signal to a power-signal switching circuit. The power-signal switching circuit, is responsive to the control logic circuit and connected to receive power from each of the first and the second power circuits for providing power to the IC. In response to the arbitration-control signal, power is provided to the power-controlled IC from a selected one of the first power circuit and the second power circuit.

In another exemplary embodiment, consisting of the previous embodiment and further comprising an over-rule circuit for assessing whether the second power circuit is to provide power to the integrated circuit as an alternative to the first power circuit providing power to the IC based on a low threshold point and the regulated level of power, and in response thereto, for providing an arbitration-control signal to the power-signal switching circuit via the control logic circuit.

In another exemplary embodiment, also consisting of the previous embodiment and wherein the over-rule circuit disables a compare circuit and a reference circuit when the regulated level of power from the first power circuit is below the low threshold point or zero and provides an arbitration-control signal to the power-signal switching circuit via the control logic circuit selecting the second power circuit to provide power to the IC.

An embodiment of the power selector circuit discloses a reference circuit to create a stable and accurate reference voltage that is the specified operating power level or a threshold level. The reference circuit then provides the reference voltage to the compare circuit to determine if the regulated supply power is above the threshold reference voltage created by the reference circuit.

Another embodiment, consisting of the previous embodiment and further comprising a compare circuit for assessing by comparing the specified operating power level or a threshold level provided by the reference circuit with the regulated level of power.

An embodiment of the present disclosure further comprising a diode block to provide a constant internal power supply used to drive: the power-signal switching circuit, the control logic circuit, an over-rule circuit, and a bias circuit.

An embodiment of the present disclosure includes a bias circuit which provides a reference current to compare, reference, and over-rule circuits. The bias circuit also produces a power-on-reset signal used by the control logic circuit. An embodiment of the present disclosure further comprising an over-rule circuit for assessing whether the second power circuit is to provide power to the integrated circuit as an alternative to the first power circuit providing power to the IC, based on a low threshold point and the regulated level of power and in response thereto, for providing an arbitration-control signal to the power-signal switching circuit via the control logic circuit. A reference circuit is to create a stable and accurate reference voltage that is the specified operating power level or a threshold level. A compare circuit assesses by comparing the specified operating power level or a threshold level provided by the reference circuit with the regulated level of power. A diode block is to provide a constant internal power supply used to drive: the power-signal switching circuit, the control logic circuit, an over-rule circuit, and a bias circuit. The bias circuit provides a reference current to compare, reference, and over-rule circuits, and also produces a power-on-reset signal used by the control logic circuit.

Another embodiment, consisting of the previous embodiment and wherein the control logic circuit is further configured for assessing whether the second power circuit is to provide power to the power-controlled IC as an alternative to the first power circuit providing power to the power-controlled IC, and in response thereto, for providing an arbitration-control signal by considering: power-on-reset signal, arbitration-control signal from the over-rule circuit, and the compare circuit's comparison of the specified operating power level or a threshold level with the regulated level of power.

In an embodiment of the present disclosure, the control logic circuit assesses the second power circuit (e.g., regulated power supply) by comparing the specified operating power level with the regulated level of power.

An embodiment wherein the specified operating power level or the threshold level is set by at least one of the following: manufacturer or user-programmed bits, feedback from the power-controlled IC, sensing the power-controlled IC's speed, a processor sensor, or a combination of the above.

An embodiment wherein the second power circuit is enabled to provide power to the IC when the regulated level of power drops below a level identified relative to the specified operating power level, and/or when the regulated level of power climbs above a level identified relative to the specified operating power level.

In another exemplary embodiment of the present disclosure, a method is disclosed for selecting a power circuit for a power-controlled IC having a specified operating power level. First, the power selector circuit powers the diode block, bias circuit, power-signal arbitration circuit, and power-signal switching circuit with the second power circuit upon power-up. Secondly, determining if the first power circuit is above the specified operating power level or a threshold level, then the first power circuit is selected to provide power to the IC, if the first power circuit is below the specified operating power level or a threshold level, then the secondary power circuit continues to power the power-controlled integrated circuit. Finally, the power selector circuit selects the second power circuit to power the IC if the first power circuit falls below the specified operating power level or a threshold level.

Another embodiment, consists of the previous embodiment and further comprising powering the overrule circuit. Determining if the first power circuit is above the low threshold point or zero, then the reference and compare circuits are enabled, if the first power circuit is below the low threshold, then the reference and compare circuits remain disabled, and no other action is taken until the first power circuit is above the low threshold point. Selecting the second power circuit to power the IC at all times if the first power circuit falls below the low threshold point or zero, and also disabling the reference and compare circuits.

In another exemplary embodiment of the present disclosure, a method is disclosed of selecting a power circuit for a power-controlled IC having a specified operating power level. First, powering the diode block, bias circuit, overrule circuit, control logic circuit, and power-signal switching circuit with the second power circuit upon power-up. Then, the power selector circuit determines if the first power circuit is above the low threshold point or zero. Finally, selecting the first power circuit to provide power to the IC when the first power circuit is above the low threshold point or zero, and selecting the second power circuit to continue to power the IC when the first power circuit is below the low threshold point or zero.

The power selector circuit maximizes battery lifetime while guaranteeing stable power output for uninterrupted power-controlled IC operation. The function of the power selector circuit is described in Equation 1.

$$V_{DD\_AO} = \begin{cases} V_{DDREG} & \text{if } V_{DDREG} > x \\ V_{BAT} & \text{otherwise} \end{cases}$$

Equation 1: Power Selector Circuit Equation

In Equation 1, x is a threshold level that determined if $V_{DDREG}$ or $V_{BAT}$ is used as the power source. By choosing x equal to the lowest operational voltage of the power-controlled IC the battery load is minimized to only necessary usage. Two power switches, cumulatively known as the power-signal switching circuit, are used to connect and disconnect the regulated and battery sources. The power switches are controlled by the control logic circuit, which will be explained in more detail below. The use of power-switches provides control over the selected supply sources. Another advantage is the negligible voltage drop across the power-switch, as further discussed below.

Turning now to the figures, FIG. 1 is a block diagram of one exemplary embodiment of the present disclosure. In FIG. 1, a first power circuit and second power circuit are provided to both the power-signal switching circuit and the power-signal arbitration circuit. The first power circuit may comprise a regulated power supply ($V_{DDREG}$), and the second power circuit may comprise a battery power supply ($V_{BAT}$). Both power circuits are communicatively coupled to the power-signal arbitration circuit and the power-signal switching circuit. In this exemplary embodiment, the power-signal arbitration circuit is programmed with a threshold voltage associated with the power-controlled IC's specified power requirements. The power-signal arbitration circuit creates a reference voltage based on the threshold voltage as programmed. Wherein, the power-signal arbitration circuit compares the $V_{DDREG}$ with the reference voltage produced, if the $V_{DDREG}$ is greater than the reference voltage, then the power-signal arbitration circuit sends an output signal to the power-signal switching circuit disabling the battery power supply and enabling the regulated power supply.

In another embodiment of FIG. 1, the power-signal arbitration circuit is programmed as above, as well as programmed with a low-threshold voltage. Similar to many circuits, the power-signal arbitration circuit may have both an always-on-domain and performance domain. Wherein the always-on-domain of the power-signal arbitration circuit, prior to the power-signal arbitration circuit completing the comparison as described in the previous paragraph, the power-signal arbitration circuit creates a reference voltage based on the low-threshold voltage as programmed. The power-signal arbitration circuit then compares the reference voltage, based on the low-threshold voltage as programmed, to the $V_{DDREG}$ to determine if the regulated supply is sufficient to enable the performance domain of the power-signal arbitration circuit. After which, the performance-domain of the power-signal arbitration circuit may complete the comparison described in the previous paragraph.

Figure 2A:
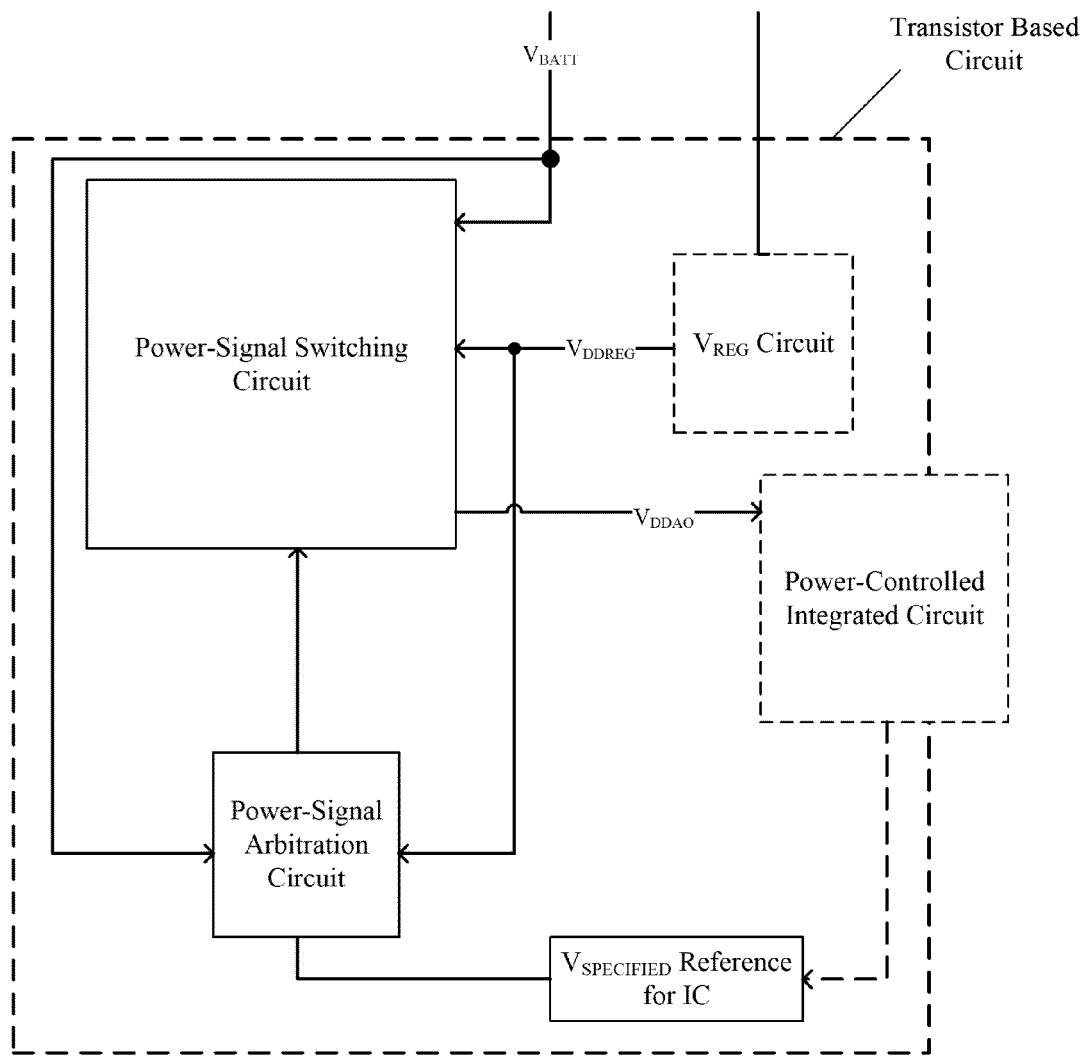
FIG. 2A shows a block diagram of another exemplary embodiment of the present disclosure.

In FIG. 2A, a block diagram of another exemplary embodiment of the present disclosure directed to a power selector circuit is shown. In the present embodiment, the power-controlled IC provides the power-signal arbitration circuit with $V_{SPECIFIED}$, a reference voltage for the powered IC, which may obviate the need for the power-signal arbitration circuit to be programmed with a threshold voltage related to the powered IC's specified power requirements. The power-signal arbitration circuit may then compare the reference voltage from the powered IC with the $V_{DDREG}$, if the $V_{DDREG}$ is greater than the reference voltage, then the power-signal arbitration circuit sends an output signal to the power-signal switching circuit disabling the battery power supply and enabling the regulated power supply. In an embodiment of the present disclosure, the $V_{SPECIFIED}$ may be provided by the Power-Controlled Integrated Circuit. In another embodiment of the present disclosure, the $V_{SPECIFIED}$ may not be directly provided to the Power-Signal Arbitration Circuit by the Power-Controlled Integrated Circuit. In this case, some embodiments may include the Power-Controlled Integrated Circuit communicating to a circuit, such as a $V_{SPECIFIED}$ Reference for IC Circuit or the Reference Circuit (as described in more detail below), the Power-Controlled IC's power requirements wherein one of the above described circuits would then create a stable and accurate reference voltage that is the threshold voltage of the power-controlled IC.

Figure 2B:
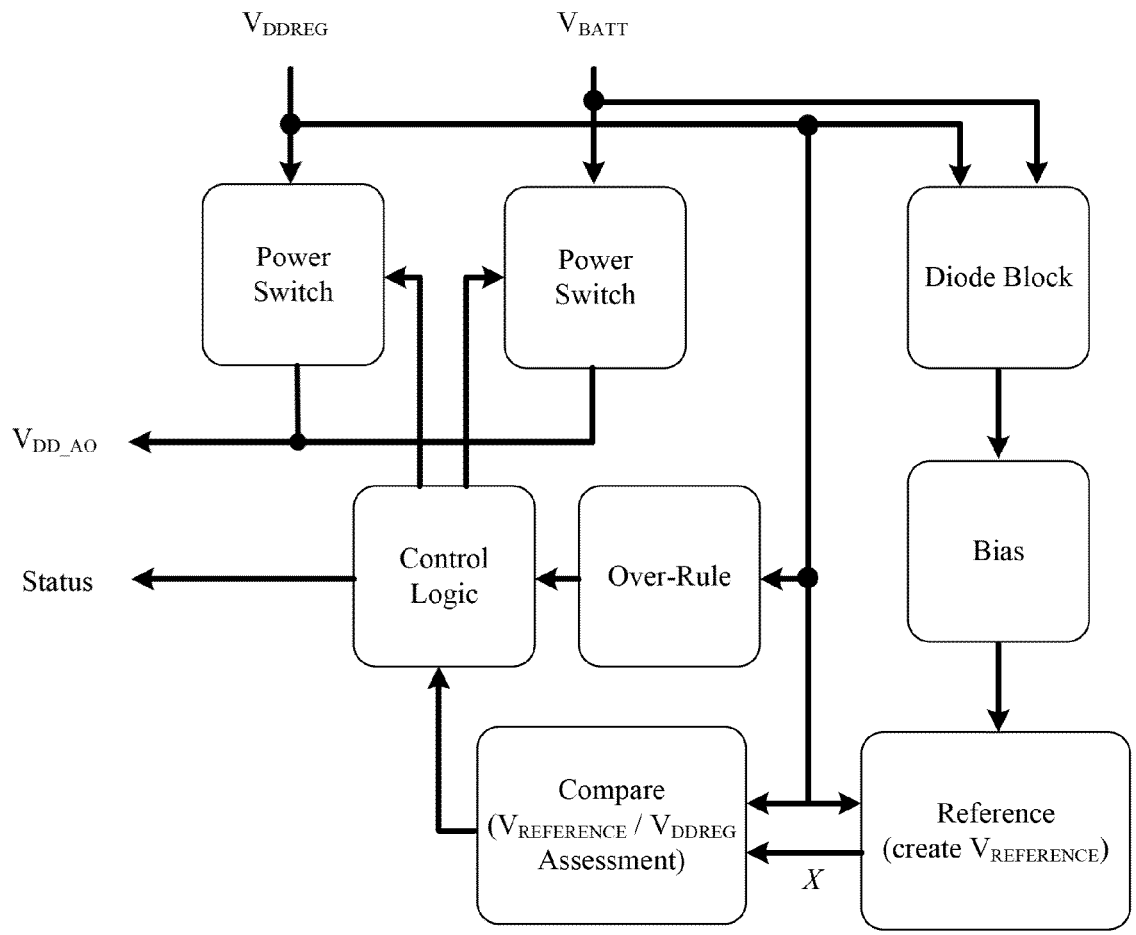
FIG. 2B shows a block diagram of another exemplary embodiment of the present disclosure.

In FIG. 2B, a block diagram of another exemplary embodiment of the present disclosure directed to a power selector circuit is depicted. FIG. 2B presents an embodiment including the following elements: control logic circuit, power-signal switching circuit, among other elements, both optional and required, of the power selector circuit which will be described in greater detail below.

The diode block functions as a current power selector and ensures a constant internal supply for wake-up/always-on-domain critical circuits of the power selector circuit. The constant internal supply drives the bulk connection of the power-signal switching circuit (comprising of power-switches), the overrule circuit, the control logic, and bias circuit.

The bias circuit is supplied by the diode block as discussed above, and generates a number of small reference currents that are used for the reference circuit, the compare circuit, and the overrule circuit. Furthermore, the bias circuit drives a power-on-reset signal used by the control logic circuit. The overrule circuit, as described below, minimizes the power consumption of the bias circuit's trigger.

The overrule circuit is supplied by the diode block and uses a bias current from the bias circuit to detect if the regulated supply is below a low threshold voltage or zero, the low threshold voltage being defined by the supplied bias current. This low threshold voltage may be, for example, 1.5 V. The low threshold voltage provided by the bias circuit need not be particularly accurate, e.g. ±0.5 V is an allowable range for the low threshold voltage. The allowable range of the bias current allows the bias circuit to consume minimal power. The overrule circuit ensures that part of the power selector circuit logic is turned-off, the performance domain, to save power once the regulated supply is below an unusable point and selects the battery as the output supply of the power selector circuit.

The reference circuit is supplied from the regulated supply input, and creates a stable and accurate reference voltage that is the threshold voltage of the power-controlled IC. The regulated supply input received by the reference circuit may be disconnected if the overrule circuit is triggered, as discussed above, due to the regulated supply being below a low threshold voltage or zero.

The reference circuit's reference voltage is transmitted to the compare circuit to be compared to the regulated power supply, wherein if the regulated power supply is above the reference voltage the regulated power supply may be used over the battery power supply.

The control logic circuit is supplied by the diode block and controls the power-signal switching circuit via input signals. The input signals of the control logic circuit include the overrule circuit's trigger signal, the bias circuit's power-on-reset signal, and the compare circuit's regulated supply above threshold voltage signal. The decision of the control logic circuit is based on the following function: if the power-on-reset is not true, if the overrule circuit is not triggered, and if the comparator circuit indicates that the regulated supply voltage is greater than the threshold voltage, also known as the reference voltage, the regulated power supply is selected. In the other cases, either the regulated supply is below the threshold voltage, or the low threshold voltage as detected by the overrule circuit, or the system is in a power-up sequence and the value of the regulated power supply cannot be detected properly.

Figure 2C:
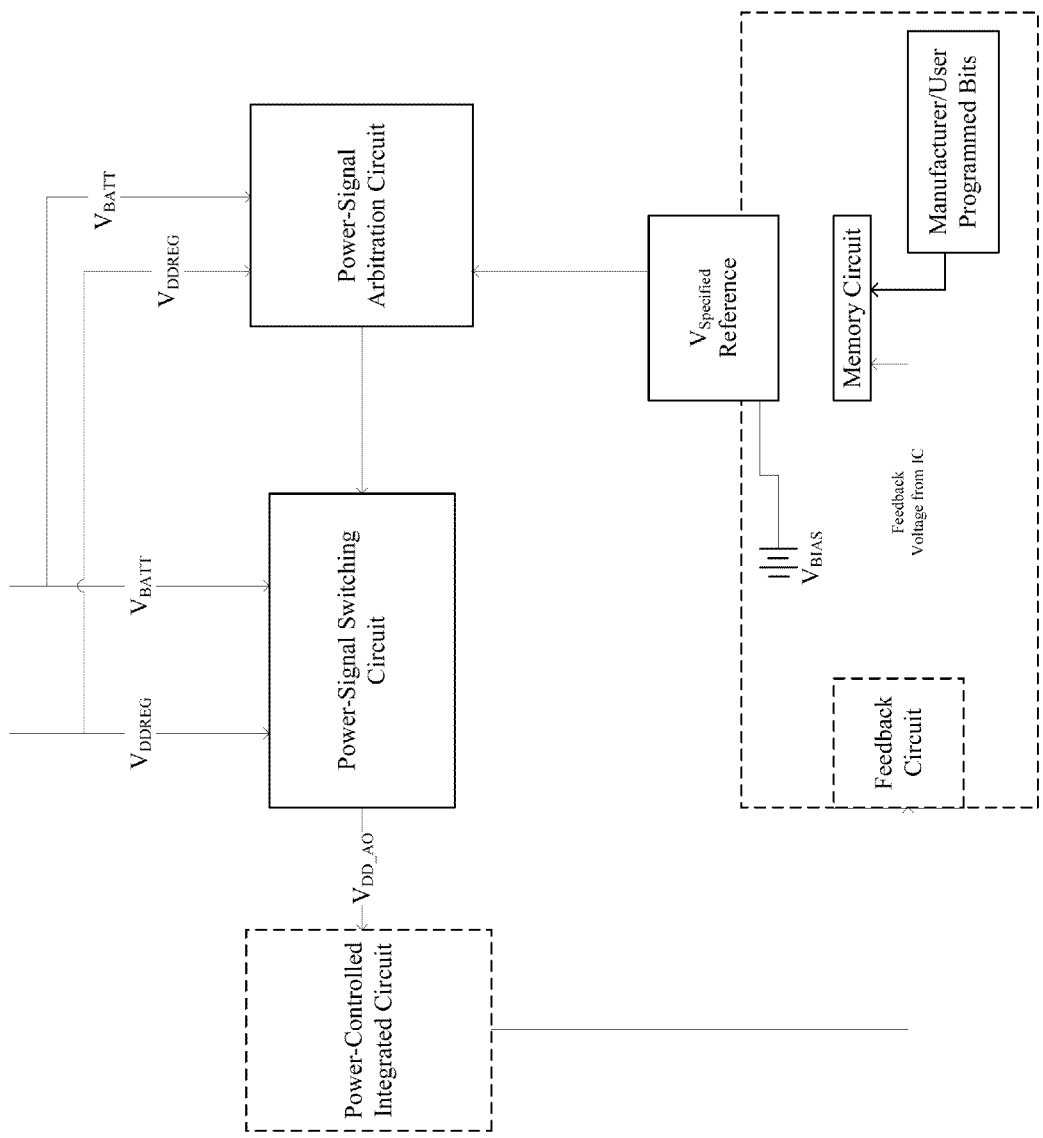
FIG. 2C shows a block diagram of another exemplary embodiment of the present disclosure.

In FIG. 2C, a block diagram of another exemplary embodiment of the present disclosure directed to a power selector circuit is illustrated. In the present embodiment, the power-signal arbitration circuit may receive a $V_{SPECIFIED}$, a reference voltage for the powered IC, from a number of sources. The sources may include: a $V_{BIAS}$ stored on a capacitor, a Feedback Voltage from the Powered IC, and also manufacturer and/or user programmed threshold levels for the Powered IC stored in a memory circuit. The power-signal arbitration circuit may then compare the reference voltage for the powered IC with the $V_{DDREG}$, wherein if the $V_{DDREG}$ is greater than the reference voltage, then the power-signal arbitration circuit sends an output signal to the power-signal switching circuit disabling the battery power supply and enabling the regulated power supply.

Figure 3:
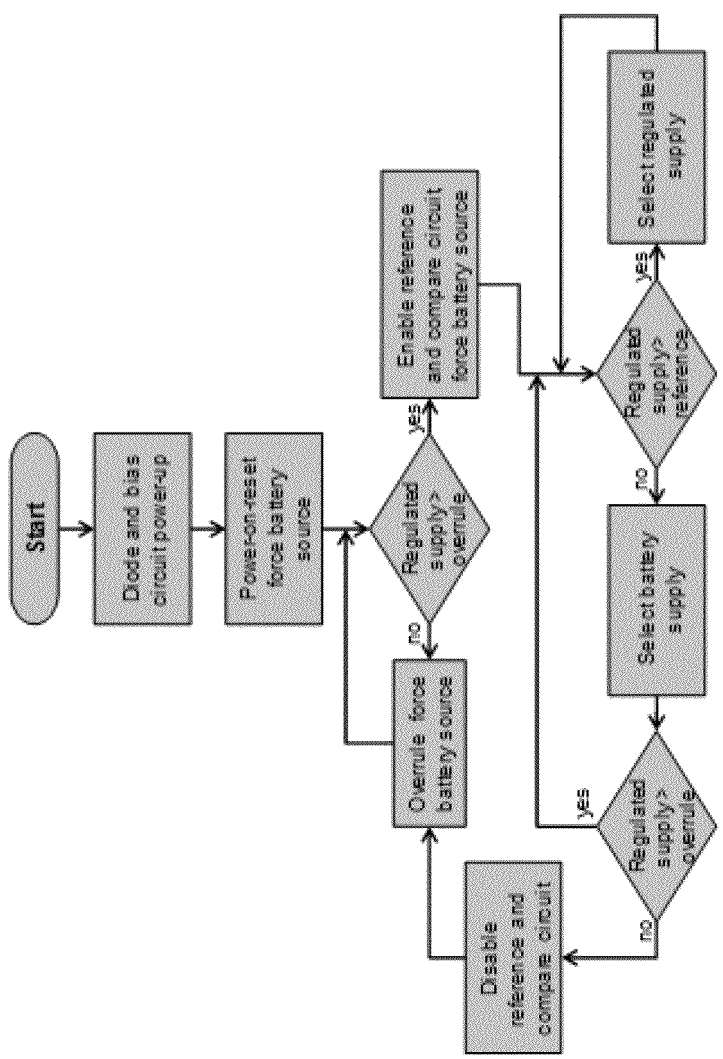
FIG. 3 shows a functional flow diagram of an exemplary embodiment of the present disclosure.

In FIG. 3, a functional flow diagram of an exemplary embodiment of the present disclosure directed to a power selector circuit is shown. During start-up, the initial voltage is created by the diode block and supplies the always-on domain components. The always-on domain components may include: the diode block circuit, the bias circuit, the overrule circuit, control logic circuit, and power-signal switching circuit. The power-on-reset function forces the battery supply to be selected as the output supply. If the battery supply is not available, the output supply is not yet available. After the power-on-reset has released the reset state, the overrule circuit verifies that the regulated supply is sufficient to start the reference and compare circuits located in the performance domain of the power selector circuit. If the regulated supply voltage is below the overrule circuit's low threshold, the battery supply remains as the output supply. If the regulated supply voltage is above the overrule circuit low threshold voltage the reference and compare circuits in the performance domain are enabled. If the regulated supply voltage is larger than the threshold voltage, also known as the reference voltage, created by the bias and reference circuits, the regulated supply is selected as the output supply. If the regulated supply voltage is lower than the threshold voltage, the battery supply is selected as the output supply. If the regulated supply voltage becomes lower than the low threshold voltage, the battery supply is selected as the output supply at all times, and the reference and compare circuits are disabled.

The embodiments of the present disclosure for the power selector circuit provide for several key benefits, including at least the following.

The present disclosure enables low regulated voltage supply without discharging the battery unnecessarily. Through the disclosures power selector circuitry, the power supply with the highest voltage is not necessarily the power source selected. Instead, the power selector circuit considers the power-controlled IC and which power supply may have a limited amount of available power, or wherein over-use may degrade the power supply (e.g. a battery).

The disclosure enables a wide battery voltage range without discharging the battery unnecessarily. With the power selector circuit, the range of battery voltage that may be used with the power-controlled IC is only limited by the threshold voltage required by the power-controlled IC. The voltage of the battery being greater than the regulated power supply does not necessarily result in the power selector circuit always selecting the battery supply.

The use of a power selector circuit results in a negligible voltage drop and associated power loss. The power selector circuit's use of switches and the ability to disable the performance domain of the power selector circuitry when the power-controlled IC is running from a battery enables the power selector circuit to achieve ultra-low-power operation. The power selector circuit's removal of voltage drop and associated power loss related to the power selector circuit allows for improved minimum voltage requirements for both the battery and regulated power supply.

In an embodiment of the present disclosure, the power selector is able to provide the power-controlled IC or other integrated circuits with the status of the first and second power supplies; including the voltage each is currently delivering to the power selector circuit, and which power source the power-controlled IC is drawing power from. The power selector circuit provides for this status output via the control logic circuit.

The power selector also enables a user or other system to override the power selector circuit and manually select a power source, wherein the status output of the control logic circuit functions as an input/output between the control logic circuit and a third-party circuit.

Various modules or other circuits may be implemented to carry out one or more of the operations and activities described herein and/or shown in the figures. In these contexts, a "module" is a circuit that carries out one or more of these or other related operations/activities (e.g., the Power-Signal Arbitration circuit, see FIG. 1, which may carry out the function of circuits described individually in other embodiments, see FIG. 2B, which may include: the control logic circuit, the compare circuit, reference circuit, etc.). For example, in several of the above-discussed embodiments, one or more modules are discrete logic circuits or programmable logic circuits configured and arranged for implementing these operations/activities, as in the circuit modules shown in FIG. 2B. In certain embodiments, such a programmable circuit is one or more computer circuits programmed to execute sets of instructions. The instructions can be in the form of firmware or software stored in and accessible from, such as a memory circuit. As an example, first and second modules may include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer or other electronic device to perform these operations/activities.

Based upon the above discussion and illustrations, those skilled in the art will readily recognize that various modifications and changes may be made to the present disclosure without strictly following the exemplary embodiments and applications illustrated and described herein. For example, utilizing the power selector to power devices other than integrated circuits. Such modifications do not depart from the true spirit and scope of the present disclosure, including that set forth in the following claims.

What is claimed is:

1. An apparatus comprising:
a first power circuit for providing a regulated voltage to and for powering an integrated circuit (IC) having an operating voltage level;
a second power circuit configured and arranged for providing power to and for powering the IC;
a control logic circuit that includes:
a compare circuit that is configured and arranged for assessing, based on the regulated voltage and a first threshold voltage level, the first threshold voltage being indicative of the operating voltage level, whether the second power circuit is to provide power to the IC as an alternative to the first power circuit providing power to the IC, and in response thereto, for providing an arbitration-control signal, and
an over-rule circuit that is configured and arranged for assessing, based on a comparison between the regulated voltage and a second threshold voltage level that is lower than the first threshold, and in response to the assessment, for disabling the compare circuit; and
a power-signal switching circuit, responsive to the control logic circuit and connected to receive power from each of the first and the second power circuits for providing power to the powered integrated circuit, configured and arranged for enabling, in response to the arbitration-control signal, power to be provided to the powered integrated circuit from a selected one of the first power circuit and the second power circuit.

2. The apparatus of claim 1, further comprising a diode block circuit that is configured to provide power, separate from the power provided by the power-signal switching circuit, to a bias circuit that is configured to generate a reference voltage corresponding to the second threshold voltage level.

3. The apparatus of claim 2, wherein the compare circuit is configured to be powered by the power to be provided to the powered integrated circuit, and to consume less power in response to being disabled by the over-rule circuit.

4. The apparatus of claim 1, further comprising a reference circuit configured and arranged to create a stable and accurate reference voltage that is provided to the compare circuit for use as the first threshold voltage.

5. The apparatus of claim 4, wherein the over-rule circuit is further configured and arranged for using a bias current to generate the second threshold voltage.

6. The apparatus of claim 1, further comprising a diode block configured and arranged to provide a constant internal power supply used to drive: the power-signal switching circuit, the control logic circuit, an over-rule circuit, and a bias circuit.

7. The apparatus of claim 1, further comprising a bias circuit configured and arranged to provide reference currents to the compare, and the over-rule circuits, also being configured and arranged to produce a power-on-reset signal used by the control logic circuit.

8. The apparatus of claim 1, further comprising:
a reference circuit configured and arranged to create a stable and accurate reference voltage that is the first threshold level; and
a diode block configured and arranged to provide a constant internal power supply used to drive: the power-signal switching circuit, the control logic circuit, the over-rule circuit, and a bias circuit that is configured and arranged to provide reference currents to the compare, reference, and over-rule circuits, and to produce a power-on-reset signal used by the control logic circuit.

9. The apparatus of claim 8, wherein the control logic circuit is further configured and arranged for assessing whether the second power circuit is to provide power to the integrated circuit as an alternative to the first power circuit providing power to the integrated circuit, and in response thereto, for providing an arbitration-control signal by considering:
the power-on-reset signal;
the arbitration-control signal from the over-rule circuit; and
a comparison of the first threshold voltage level with the regulated voltage.

10. The apparatus of claim 8, wherein the reference circuit is further configured and arranged for generating the first threshold voltage level by storing the reference currents on a capacitor.

11. The apparatus of claim 1, wherein the operating voltage level or the first threshold level is set by at least one of the group consisting of manufacturer or user programmed bits, feedback from the integrated circuit, sensing a speed of the integrated circuit, a processor sensor, and combinations thereof.

12. The apparatus of claim 1, wherein the second power circuit is enabled to provide power to the powered integrated circuit in response to the regulated voltage droping below the first threshold voltage level.

13. The apparatus of claim 1, wherein the second power circuit is enabled to provide power to the integrated circuit when the regulated voltage is between the first and second threshold voltage levels.

14. A method of selecting a power circuit for an integrated circuit having an operating voltage level comprising:
powering a diode block, bias circuit, control logic circuit, and power-signal switching circuit with a second power circuit upon power-up;
determining that an operating voltage level of the integrated circuit is above a first threshold voltage level;
selecting, in response to determining that the operating voltage level is above the first threshold voltage level, a first power circuit to provide power to the integrated circuit;
determining that an operating voltage level of the integrated circuit is below the first threshold voltage level;
selecting, in response to determining that the operating voltage level is below the first threshold voltage level, the second power circuit to power the integrated circuit;
determining that an operating voltage level of the integrated circuit is below a second threshold voltage level that is lower than the first threshold; and
disabling, in response to determining that the operating voltage level is below the second threshold voltage level, a compare circuit in the control logic circuit.

15. The method of claim 14, wherein
the determining that an operating voltage level of the integrated circuit is below a second threshold voltage level is implemented using an overrule circuit; and
the disabling the compare circuit further includes disabling a reference circuit that generates the first threshold voltage level.

16. A method of selecting a power circuit for a powered integrated circuit having a specified operating power level comprising:

powering a diode block, bias circuit, overrule circuit, control logic circuit, and power-signal switching circuit with a second power circuit upon power-up;

determining that a voltage for power provided by a first power circuit is above a low threshold point;

enabling, in response to determining that a regulated voltage for power provided by the first power circuit is above the low threshold point, a compare circuit in the control logic;

determining, using the compare circuit, that the regulated voltage is above a high threshold point that is higher than the low threshold point; and selecting, in response the determining that the regulated voltage is above the high threshold point, the first power circuit to provide power to the powered integrated circuit.

17. The method of claim 16, further including disabling the compare circuit in response to determining that the regulated voltage is below the low threshold point.

18. The method of claim 16, further including powering, using a diode block, a bias circuit; and generating, using a reference current from the bias circuit, a reference voltage corresponding to the high threshold point.

* * * * *